(12) United States Patent
Nguyen et al.

(10) Patent No.: US 6,566,610 B1
(45) Date of Patent: May 20, 2003

(54) STACKING MULTIPLE DEVICES USING DIRECT SOLDERING

(75) Inventors: Chinh Nguyen, Irvine, CA (US); Phu Hoang, Foothill Ranch, CA (US); Phan Hoang, Mission Viejo, CA (US); Andy Le, Garden Grove, CA (US)

(73) Assignee: Virtium Technology, Inc., Irvine, CA (US)

( * ) Notice: Subject to any disclaimer, the term of this patent is extended or adjusted under 35 U.S.C. 154(b) by 0 days.

(21) Appl. No.: 10/032,908

(22) Filed: Nov. 1, 2001

(51) Int. Cl.[7] .................................................. H05K 1/16
(52) U.S. Cl. ............................ 174/260; 29/840; 29/842
(58) Field of Search ..................... 174/260; 439/65–75; 361/767, 769–774, 808; 24/840, 842

(56) References Cited

U.S. PATENT DOCUMENTS

| | | | | |
|---|---|---|---|---|
| 4,074,342 A | * | 2/1978 | Honn et al. ................. 257/717 |
| 5,291,375 A | * | 3/1994 | Mukai ......................... 174/259 |
| 5,349,495 A | * | 9/1994 | Visel et al. .................. 174/267 |
| 5,412,538 A | * | 5/1995 | Kikinis et al. .............. 174/260 |
| 6,031,728 A | * | 2/2000 | Bedos et al. ................ 174/255 |
| 6,271,480 B1 | * | 8/2001 | Yamaguti et al. ........... 174/260 |

\* cited by examiner

*Primary Examiner*—David L. Talbott
*Assistant Examiner*—Jeremy Norris
(74) *Attorney, Agent, or Firm*—Blakely, Sokoloff, Taylor & Zafman, LLP

(57) ABSTRACT

In one embodiment of the invention, a stacking element includes a printed circuit board (PCB) and a plurality of solder bumps. The PCB has a top side and a bottom side. The top side is attached to first pins of a first device. The plurality of solder bumps are on the bottom side and attached to upper areas of second pins of a second device to provide electrical connections between the first pins and the second pins.

15 Claims, 3 Drawing Sheets

STACKING MULTIPLE DEVICES USING DIRECT SOLDERING

BACKGROUND

1. Field of the Invention

This invention relates to packaging. In particular, the invention relates to stacking integrated circuit (IC) devices.

2. Description of Related Art

Demands for high density boards in microprocessor systems have created many challenges to the board assembly process. Among several methods, stacking multiple integrated circuit (IC) devices saves a significant amount of space on printed circuit board (PCB).

Existing techniques to stack multiple IC devices have a number of drawbacks. One technique solders the pins of the top device onto a flexible interconnecting element which is bent to be soldered to the pins of the bottom device. Another technique bends the pins of the top device and soldering the bent pins to the upper portion of the pins of the bottom device. Yet another technique solders the underneath area between the heel and the toe of the J-lead pins of the top device onto the surface area between the heel and the toe of the J-lead pins of the bottom device. These techniques have several disadvantages. First, the mechanical support is weak leading to easy mechanical failure. Second, the soldering is not solid and usually does not follow common manufacturing standard which may lead to unreliable electrical contacts.

Therefore, there is a need to have an efficient technique to stack multiple IC devices.

BRIEF DESCRIPTION OF THE DRAWINGS

The features and advantages of the present invention will become apparent from the following detailed description of the present invention in which.

DESCRIPTION OF THE INVENTION

The present invention is a technique for stacking multiple IC devices. The technique uses a stacking element inserted between a first device and a second device. The stacking element includes a printed circuit board (PCB) and a number of solder bumps. The PCB has a top side and a bottom side. The first device and the second device have a number of external connecting elements, terminals, pins, or legs. The top side is attached to the first pins of the first device. The solder bumps are on the bottom side and attached to upper areas of the pins of the second device to provide electrical connections between the first pins and the second pins. The technique provides stable and strong mechanical structure and solid electrical contacts. In addition, the technique is inexpensive because it may be carried out using standard soldering processes.

In the following description, for purposes of explanation, numerous details are set forth in order to provide a thorough understanding of the present invention. However, it will be apparent to one skilled in the art that these specific details are not required in order to practice the present invention. In other instances, well-known structures are shown in block diagram form in order not to obscure the present invention.

Figure 1:
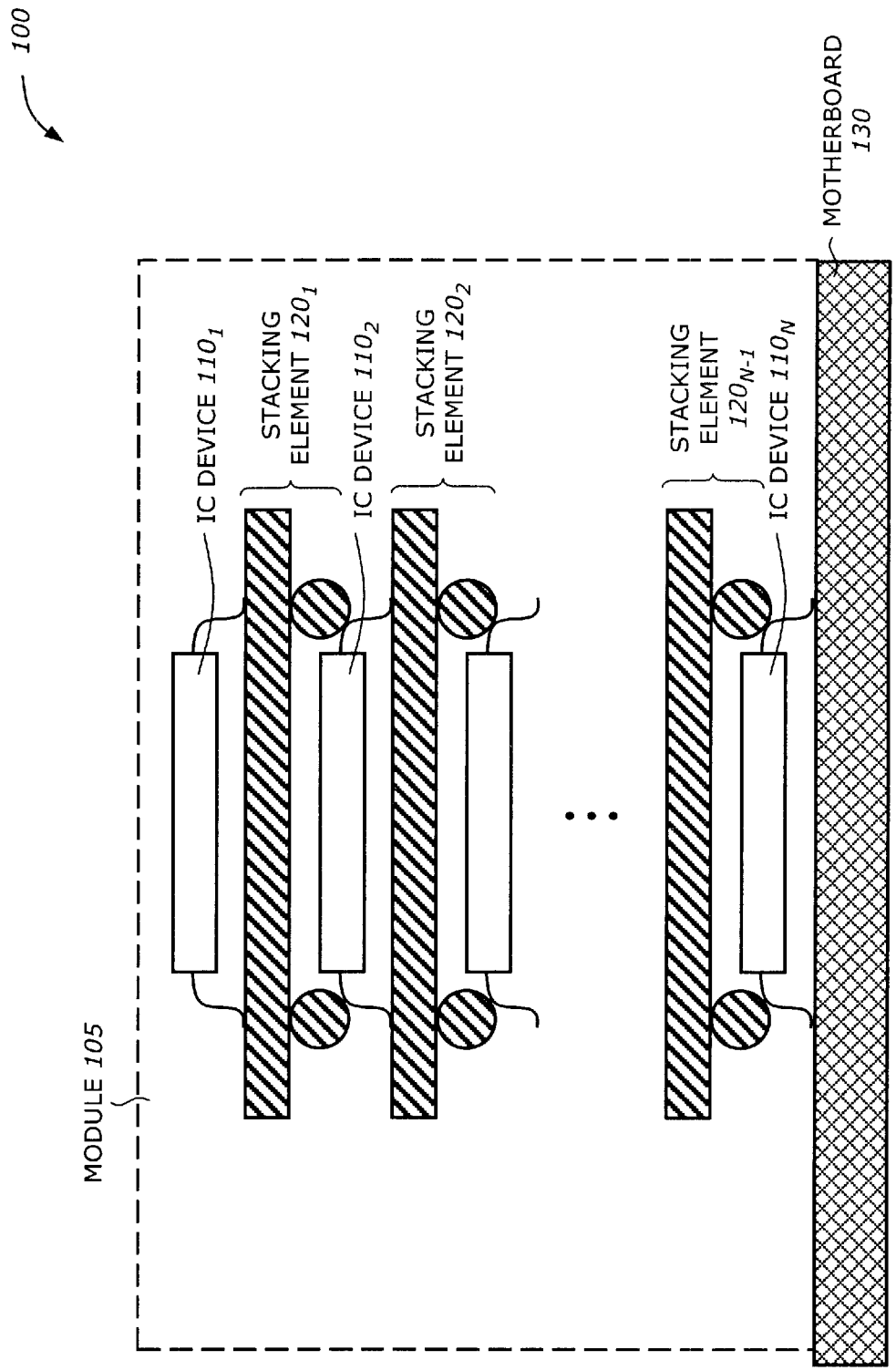
FIG. 1 is a diagram illustrating a module of multiple stacked IC devices in which one embodiment of the invention can be practiced.

FIG. 1 is a diagram illustrating a system 100 in which one embodiment of the invention can be practiced. The system 100 includes a module 105 and a motherboard 130.

The module 105 includes N IC devices $110_1$ to $110_N$ and N−1 stacking elements $120_1$ to $120_{N-1}$ where N is a positive integer number. The N IC devices $110_1$ to $110_N$ are stacked one on top of another in a vertical direction. As is known by one skilled in the art, the actual orientation of the module 105 may be in any suitable direction including vertical, horizontal, or angular. The stacked IC devices $110_1$ to $110_N$ provide a significant board spacing by having the same footprint as one IC device on the motherboard 130. The module 105 is rigid and has stable mechanical structure. The N stacked IC devices $110_1$ to $110_N$ are any IC devices such as memory devices, buffers, logic circuits, processors, etc. In one embodiment, the N IC devices $110_1$ to $110_N$ are identical or like devices with similar pin-out and packaging. In particular, memory devices such as dynamic random access memory (DRAM), static random access memory (SRAM), flash memory, read only memory, electrically erasable read only memory (EEROM) are suited for this application. The N IC devices $110_1$ to $110_N$ have the same packaging. The packaging may be any suitable packaging such as surface mount devices (SMD) J-lead chip carrier (JLCC), gull-wing lead, thin quad flat pack (TQFP), plastic quad flat pack (PQFP), thin small outline package (TSOP), and shrink thin small outline package (STSOP).

Each of the N−1 stacking elements $120_1$ to $120_{N-1}$ is inserted between two IC devices of the N IC devices $110_1$ to $110_N$ to provide electrical connections between the pins of these two devices. Circuit lay-out in each of the N−1 stacking elements $120_1$ to $120_{N-1}$ provides suitable connections of the signals of the N IC devices $110_1$ to $110_N$ such as no-connection, chip enable, etc.

The motherboard 130 contains other elements or devices including the module 105. The motherboard 130 may also contain signal traces that correspond to the pins of the N IC devices 110 and $110_N$. The bottom device $110_N$ of the module 105 is soldered on the motherboard 130. Therefore, with respect to the surface of the motherboard 130, the IC devices 110 to $110_N$ are stacked in the vertical direction. Note that the reference to the motherboard 130 is merely for illustrative purposes. The module 105 may be placed on any board at any orientation.

Figure 2:
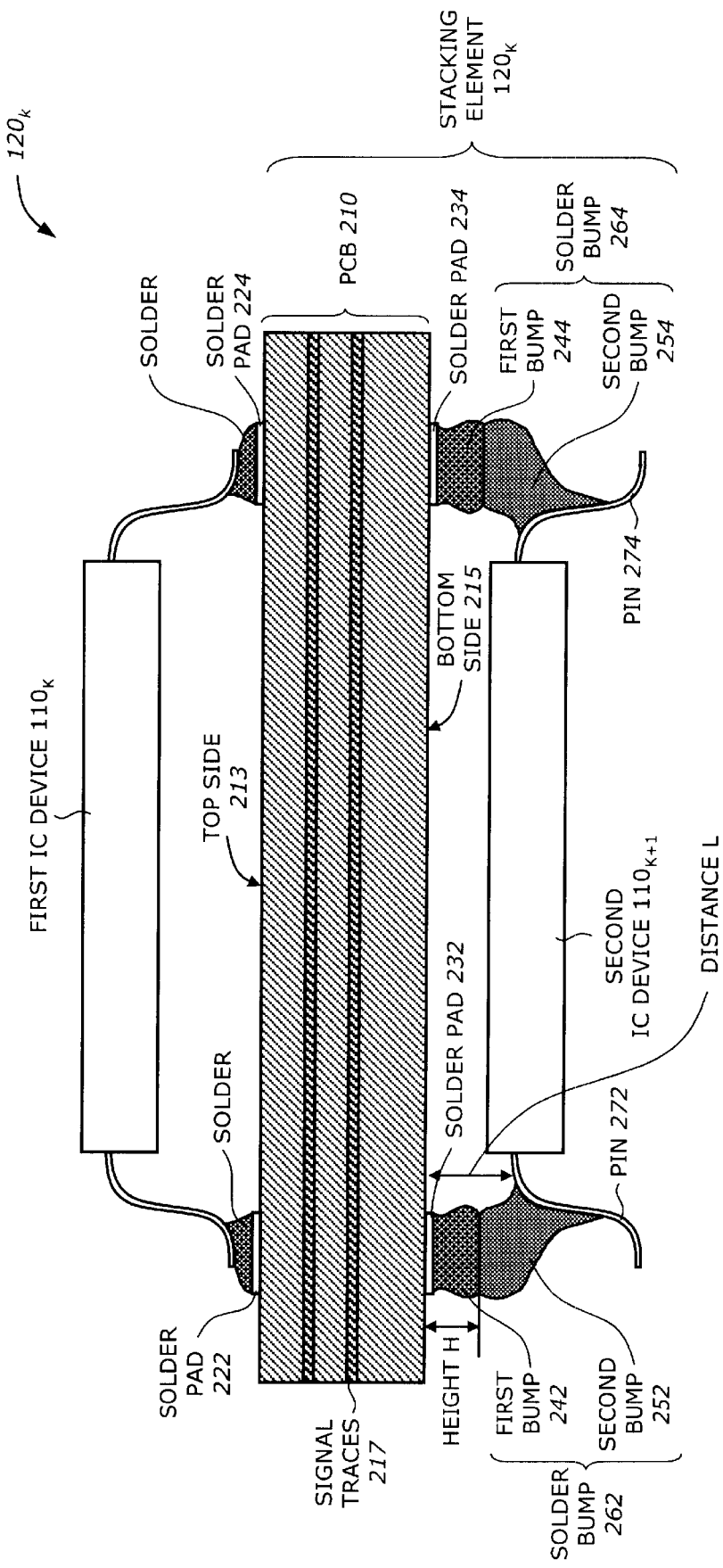
FIG. 2 is a am illustrating a stacking element shown in FIG. 1 according to one embodiment of the invention.

FIG. 2 is a diagram illustrating the stacking element $120_k$ shown in FIG. 1 according to one embodiment of the invention. The stacking element $120_k$ is inserted between a first device $110_k$ and a second device $110_{k+1}$. The stacking element $120_k$ includes a printed circuit board (PCB) 210 and a number of solder bumps 262 and 264.

The PCB 210 has a top side 213 and a bottom side 215. The top side 213 has a number of solder pads corresponding to the pins of the first device $110_k$. The bottom side 215 also has a number of solder pads corresponding to the pins of the second device $110_{k+1}$. The solder pads have land patterns that conform to PCB assembly standards such as the Interconnecting and Packaging Electronic Circuits (IPC) American National Standards Institute (ANSI) or Electronic Industries Alliance (EIA) standard J-STD-001 "Requirements for Soldered Electrical and Electronic Assemblies" published by EIA in March 2000. Only a pair of solder pads 222 and 224 on the top side 213 and a pair of solder pads 232 and 234 on the bottom side 215 are shown for illustrative purposes only. The top side 213 is attached to the first device $110_k$ by soldering the pins of the first device $110_k$ to the solder pads 222 and 224. The soldering process that attaches the first device $110_k$ to the PCB 210 is a standard soldering process in manufacturing assembly.

The PCB 210 has a number of layers including a signal layer that has a number of signal traces 217 of conductive material to electrically connect the solder pads on the top side 213 to the solder pads on the bottom side 215. The PCB 210 is made of standard PCB material such as FR-4. The use of the PCB 210 provides strong mechanical support for the module 105.

The solder bumps 262 and 264 are located on the bottom side 215 and are attached to the upper areas of the pins of the second device $110_{k+1}$ to provide electrical connections between the pins of the two devices $110_k$ and $110_{k+1}$. Since the upper area of the pin of the second device $110_{k+1}$ has a large surface contact, the soldering to the pins of the second device $110_{k+1}$ is solid and stable, satisfying or exceeding the requirements of assembly standards such as the IPC ANSI/J Standard 001C. In addition, the soldering process can be carried out using standard soldering processes used in a typical assembly line.

The solder bumps 262 and 264 are similar. For brevity, only the solder bump 262 is described in the following. The solder bump 262 includes a first bump 242 and a second bump 252. The first bump 242 is in essence a raised solder pad. The first bump 242 may be any conductive material formed on the solder pad during the fabrication of the PCB 210 or is a solder bump provided in a soldering process. When the first bump 242 is provided in a soldering process, it is soldered to the solder pad 232 to provide a pedestal having a height H. The first bump 242 may be made by typical solder material such as a metal alloy composed of tin and lead with proper proportions. The height H is typically less than a distance L between the bottom side 215 of the PCB 210 and the upper area of the pin 272. Typical values of H and L are 0.25 mm±0.05 and 0.30 mm±0.05, respectively. As is known by one skilled in the art, other dimensions comparable with the IC device $110_{k+1}$ and/or the PCB 210 may be used. The first bump 242 is cured or treated in a first soldering process or pass. Typically, the first bump 242 has a fairly flat surface. The second bump 252 is attached between the first bump 242 and the upper area the corresponding pin of the second device $110_{k+1}$. The soldering process for the second bump 252 is a second soldering process or pass to electrically connect the first bump 242 to pin 272 of the second device $110_{k+1}$. It should be noted that although the solder bump 262 is described as having two solder bumps, it is contemplated that the solder bump 262 may be formed by a raised pad and a solder bump, one integrated solder bump, more than two solder bumps, one raised pad and two solder bumps, or any combination thereof.

Since the distance L between the upper area of the pin 272 of the second device $110_{k+1}$ to the bottom side 215 is usually larger than the size of a typical solder bump, the pedestal as provided by the first bump 242 serves a main purpose to shorten this distance so that the second bump 252 may be provided by a standard second soldering process. The two solder bumps 242 and 252 therefore provide a solid and stable soldering contact between the solder pad 232 and the pin 272. When all the pins of the first device $110_k$ and the second device $110_{k+1}$ are attached to the PCB 210 in this manner, a strong mechanical structure can be created. Any number of devices may be stacked in the same way using a suitable number of stacking elements $120_k$. The overall module 105 is therefore mechanically solid and electrically stable. In addition, since the entire process can be accomplished in a standard PCB assembly process, the manufacturing cost is inexpensive.

Figure 3:
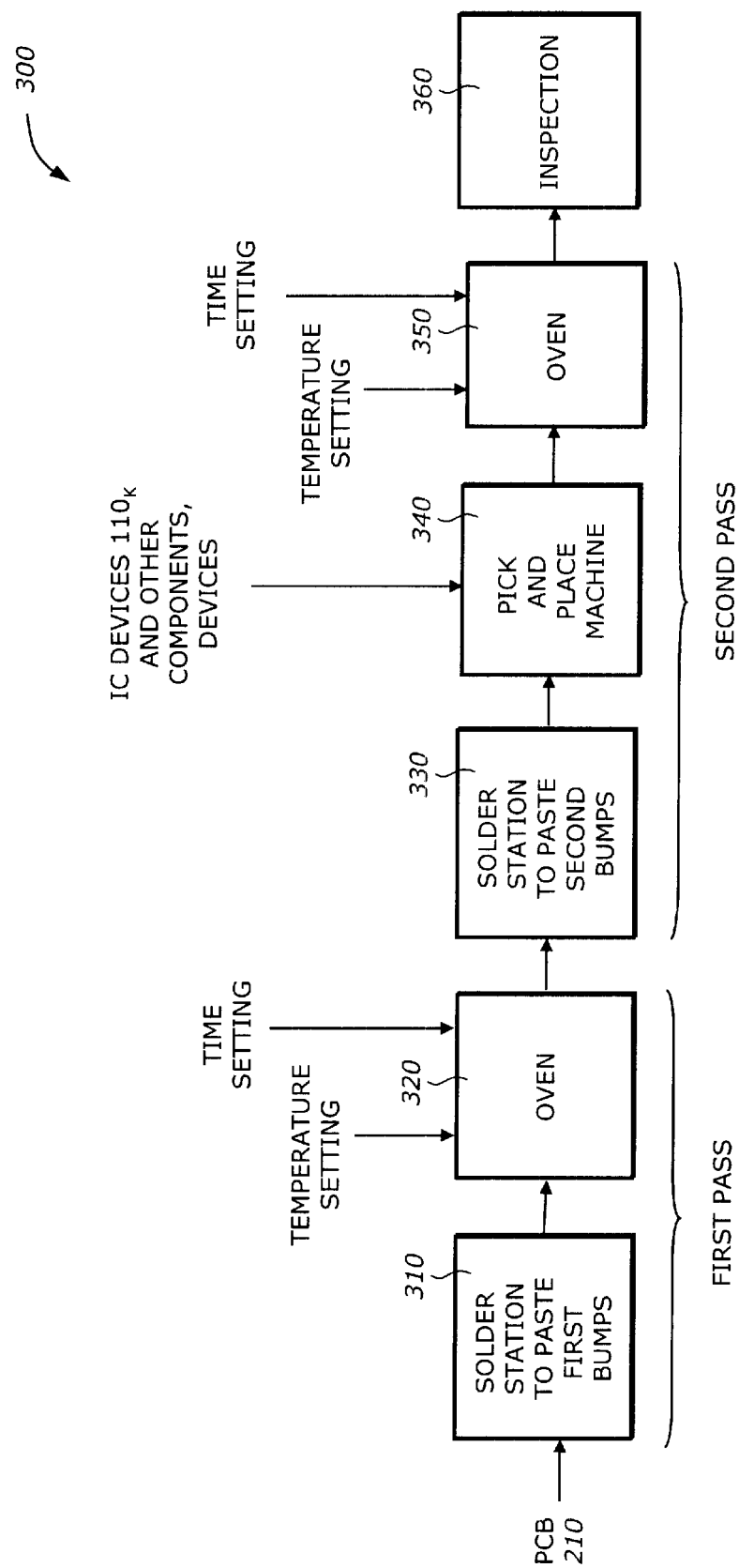
FIG. 3 is a diagram illustrating an manufacturing/assembly process for the module shown in FIG. 1 according to another embodiment of the invention.

FIG. 3 is a diagram illustrating a manufacturing/assembly process 300 for the module shown in FIG. 1 according to another embodiment of the invention.

First, the PCB 210 is pasted with the first bumps 242 on the solder pads on the bottom side of the PCB 210 in the solder station 310. The first bumps are typically high-temperature wet solder. Then, the PCB 210 with the first bumps 242 pasted on is cured or treated in an oven 320 to dry out and harden the first bumps. In one embodiment, the temperature used in the oven 320 is approximately 215° C. and the cure time or heating time is approximately 5 minutes. This process is referred to as a first soldering process or pass.

After the first soldering pass, the process 300 starts a second soldering pass. The first soldering pass and the second soldering pass are independent. The second soldering pass may begin immediately or long after the first soldering pass. In the second soldering pass, the PCB 210 with the first bumps 242 is soldered to the IC devices $110_k$ and $110_{k+1}$ in a standard solder station 330 in a typical PCB assembly procedure. Other components or devices such as discrete elements (e.g., capacitors, resistors) may also be soldered in this solder station 330 accordingly. The PCB 210 is pasted with the second bumps 252 on the first bumps 242. The second bumps 252 are typically standard-temperature wet solder. The solder station 330 may be the same as or different than the solder station 310. Then the PCB 210 with the first and second bumps go through a pick and place machine 340. The pick and place machine 340 places the IC device $110_k$ and other components or devices on the PCB 210. The IC device $110_{k+1}$ is placed on the PCB 210 such that the upper area of pin 272 (FIG. 2) rests on this wet paste of the second bump 252. Other components and devices are also placed at appropriate places.

Then, the PCB 210 with the first bumps, second bumps, the IC devices, and other components are cured or treated in an oven 350 to dry out the bumps. The oven 350 may be the same as or different than the oven 320. In one embodiment, the temperature used in the oven 350 is approximately 185° C. and the cure time or heating time is approximately 5 minutes. As it dries after passing through the oven 350, pin 272 is soldered onto the first bump 242 via the second bump 252 making connection to solder pad 232.

Then, the complete assembly of the module 105 is inspected by an inspection station 360. The inspection may be manual or automatic to ensure that the soldering joints are properly formed. Defects such as bridging, shorts, opens, and solder voids can be detected. Other assembly conditions such as component placement, device identification, and orientation are also inspected as appropriate.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
    a printed circuit board (PCB) having a top side and a bottom side to attach to first pins of a first device to the top side, the top side having first solder pads soldered to the first pins, the bottom side having second solder pads soldered to the plurality of solder bumps; and
    a plurality of solder bumps on the bottom side and attached to upper areas of second pins of a second device to provide electrical connections between the first pins and the second pins, each of the solder bumps comprising:
        a first bump soldered to one of the second solder pads to provide a pedestal having a height less than a distance between the bottom side of the PCB and one of the upper areas of one of the second pins, the first bump being provided by a first soldering pass, and
        a second bump attached between the first bump and a corresponding upper area of one of the second pins of the second device in a second soldering pass to electrically connect the first bump to the one of the second pins.

2. The apparatus of claim 1 wherein the PCB includes signal traces to connect the first solder pads to the second solder pads corresponding to the electrical connections between the first and second pins.

3. The apparatus of claim 1 wherein at least one of the first and second soldering passes conforms to a manufacturing standard.

4. The apparatus of claim 1 wherein the first and second devices are identical devices.

5. The apparatus of claim 4 wherein the identical devices are memory devices.

6. A method comprising:
    attaching a printed circuit board (PCB) having a top side and a bottom side to first pins of a first device to the top side, the top side having first solder pads soldered to the first pins, the bottom side having second solder pads soldered to the plurality of solder bumps; and
    attaching a plurality of solder bumps on the bottom side to upper areas of second pins of a second device to provide electrical connections between the first pins and the second pins, attaching a plurality of solder bumps comprising:
        providing a pedestal having a height less than a distance between the bottom side of the PCB and one of the upper areas of one of the second pins by a first bump soldered to one of the second solder pads, the first bump being provided by a first soldering pass, and
        electrically connecting the first bump to the one of the second pins by a second bump attached between the first bump and a corresponding upper area of one of the second pins of the second device in a second soldering pass.

7. The method of claim 6 wherein attaching the PCB to the first pins comprises connecting the first solder pads to the second solder pads by signal traces in the PCB corresponding to the electrical connections between the first and second pins.

8. The method of claim 6 wherein at least one of the first and second soldering pass conforms to a manufacturing standard.

9. The method of claim 6 wherein the first and second devices are identical devices.

10. The method of claim 9 wherein the identical devices are memory devices.

11. A module comprising:
    a first device and a second device having first pins and second pins, respectively; and
    a stacking element to stack the first device on the second device, the stacking element comprising:
        a printed circuit board (PCB) having a top side and a bottom side to attach to the first pins of the first device to the top side, and
        a plurality of solder bumps on the bottom side and attached to upper areas of the second pins of the second device to provide electrical connections between the first pins and the second pins, each of the solder bumps comprising:
            a first bump soldered to one of the second solder pads to provide a pedestal having a height less than a distance between the bottom side of the PCB and one of the upper areas of one of the second pins, the first bump being provided by a first soldering pass, and
            a second bump attached between the first bump and a corresponding upper area of one of the second pins of the second device in a second soldering pass to electrically connect the first bump to the one of the second pins.

12. The module of claim 11 wherein the PCB includes signal traces to connect the first solder pads to the second solder pads corresponding to the electrical connections between the first and second pins.

13. The module of claim 11 wherein at least one of the first and second soldering passes conforms to a manufacturing standard.

14. The module of claim 11 wherein the first and second devices are identical devices.

15. The module of claim 14 wherein the identical devices are memory devices.

* * * * *